United States Patent [19]

DeForest et al.

[11] 4,053,351

[45] Oct. 11, 1977

[54] CHEMICAL MACHINING OF SILICA AND GLASS

[75] Inventors: William S. DeForest, Seal Beach; Henry V. Connelly, Jr., Corona, both of Calif.

[73] Assignee: Rockwell International Corporation, El Segundo, Calif.

[21] Appl. No.: 785,376

[22] Filed: Apr. 7, 1977

Related U.S. Application Data

[63] Continuation of Ser. No. 634,015, Nov. 21, 1975, abandoned.

[51] Int. Cl.² .............................................. C23F 1/02
[52] U.S. Cl. .................................. 156/661; 156/656; 156/663
[58] Field of Search .............................. 156/650-652, 156/654-656, 657, 659, 661, 663, 664; 65/31; 252/79.3; 96/36, 36.1, 36.2, 38.3

[56] References Cited

U.S. PATENT DOCUMENTS

| 3,202,094 | 6/1965 | Smallman | 96/36.4 |
| 3,519,504 | 7/1970 | Cuomo | 156/655 X |
| 3,544,401 | 12/1970 | Jarman | 156/657 X |
| 3,554,821 | 1/1971 | Caulton et al. | 156/651 X |
| 3,986,876 | 10/1976 | Abita | 156/633 X |

Primary Examiner—William A. Powell
Attorney, Agent, or Firm—H. Fredrick Hamann; G. Donald Weber, Jr.; G. H. Friedman

[57] ABSTRACT

A method of chemical machining of glass and all single-crystal, polycrystalline and amorphous forms of silica and like materials susceptible to etching by acid fluoride etchants. Relatively high-rate precision machining of deep cuts is enabled by using etching masks which are both highly adherent to glass and silica surfaces and highly resistant to attack by concentrated hydrofluoric acid. The etching mask is preferably a deposited composite of a relatively thin layer of metal highly adherent to said surfaces covered by a relatively thicker layer of etch resistant metal. Preferably, the etching mask surface is then sealed with a wax or an additional electrodeposited sealing layer of etch resistant metal.

13 Claims, 4 Drawing Figures

CHEMICAL MACHINING OF SILICA AND GLASS

The invention herein described was made in the course of or under a contract or subcontract thereunder with the United States Navy.

This is a continuation of application Ser. No. 634,015 filed Nov. 21, 1975, now abandoned.

BACKGROUND OF THE INVENTION

1. Field of the Invention

The present invention relates to improvements in the chemical machining of silica, glass and like materials and, more particularly, to new and improved methods of precisely machining relatively deep cuts in silica, glass and the like at relatively high speeds.

2. Description of the Prior Art

Prior to selectively etching portions of objects or thin films of silica or glass, an etching mask is formed on the surface of the object or film to delineate the portion of the surface thereof to be contacted by etchant. Etchants commonly used for silica and glass are aqueous acid fluoride solutions. Effective etching masks must be formed from maskant materials which are highly resistant to these etchants. In addition, it is desirable that the maskant be highly adherent to those portions of the surface of the object or film which are to be protected from reaction with the etchant. Various photoresist materials, well known in the art, are effective maskants where the depth of etch required is on the order of 10,000 angstroms or less. This is typically the case in microelectronic circuit processing. However, in chemical machining where the depth of the etch in silica or glass is required to be on the order of one mil or more, the use of currently available photoresist materials is not practical. Even when fairly concentrated acid fluoride etchants are used, the rate of removal of silica or glass is less than 100 microinches per minute at room temperature. Over an extended etching period, the adhesion of photoresists to the silica or glass surfaces to be protected is impaired and, eventually, the photoresist material itself is lifted and washed away. Thus, for the relatively long etching times associated with chemical machining of silica and glass, the common practice has been to use maskants of wax although mixtures of wax and asphalt have occasionally been used. These materials are known to be highly resistant to acid fluoride etchants. For some applications, the wax maskant is protected by a metal template. This configuration is equally well described by calling it one in which an etch-resistant metal mask is held in place on and sealed to the appropriate surface regions of the silica or glass object by wax. Waxes usable as maskants (or seals) include peraffin waxes, chlorinated and unchlorinated glycidal esters of fatty acids, mixtures of these waxes, or a mixture of one or more of these waxes with asphalt. However, these materials have not proved to be effective maskants for chemical machining due to their relatively poor adhesion to silica and glass, particularly over relatively long etching times.

In one application of the chemical machining processes discussed herein, a portion of an article of quartz cut from a single crystal is required to be machined from an original thickness of about 30 mils to a finished thickness of from 1.5 to 2 mils. Precision of machining is required since the article is used in instruments such as accelerometers. Its physical dimensions and mechanical characteristics are therefore required to be within close tolerances of predetermined values. In this application, the machined region of the quartz forms a flexure for the accelerometer. Forming such a flexure by abrasive cutting would leave undesirable defects in the surface of the quartz.

One problem encountered when the prior art method of chemical machining is used, such as in forming a thin flexure region in quartz as discussed above, is lateral etching or undercut beneath the maskant. A relatively long tapering undercut results from seepage of etchant between the poorly adhering maskant and the quartz. It is not uncommon for the maximum lateral penetration of the etchant, and consequent removal of material under the maskant, to be as much as four times greater than the depth of etch. Relatively severe undercut occurs even when wax maskant is heated and reflowed one or more times between intervals of chemical machining. For some critical applications, parts are completely cleaned and recoated with fresh wax several times during intervals in the chemical machining to attain a reduced level of undercut. It has been determined that the etchant must be relatively dilute, i.e., less than about 50% by weight of hydrogen fluoride, to keep the undercut within the four to one range mentioned above. However, the more dilute the etchant, the more time is required for chemical machining.

Some prior art processes use very long chemical machining periods in a static etchant which is a mixture of one part of about 49% (by weight) hydrofluoric acid in an equal volume of cationic or non-ionic wetting agent. The wetting agent has an affinity for wax and tends to provide some sealing between the maskant and the silica or glass surface. With little or no agitation of the etchant, the use of the wetting agent reduces undercut to about two units of lateral etch for each unit of etching depth. However, for chemical machining the flexure region mentioned above, where about 14 mils of quartz are required to be removed from each side of the quartz blank, the exposure time required in the etchant is as much as 50 hours. This is due to the lack of agitation and the relatively low concentration of hydrogen fluoride in the etchant. Agitation cannot be used without destroying the tenuous film formed by the wetting agent and wax.

A need exists for methods of chemically machining silica and glass which are more rapid than the prior art methods and which give a more precise result by reducing undercut.

SUMMARY OF THE INVENTION

This invention provides an improved method for chemically machining glass and all single-crystal, polycrystalline and amorphous forms of silica. More precise and higher-rate machining of these materials is attained by using an etching mask on the object or part to be machined which is both highly adherent thereto and highly resistant to concentrated acid fluoride etching solutions for an extended period of time. In a preferred embodiment, the etching mask is formed by first depositing a highly adherent layer of chromium or chromium-nickel on the object. This layer is kept relatively thin to keep metallic stresses within acceptable bounds. Then an outer layer of a highly etch-resistant metal is deposited on the adherent layer. After delineating those regions of the object which are to be chemically machined by selective removal of portions of this composite etching mask, the surface thereof is preferably sealed either with a wax or a low-stress relatively thick electrodeposited layer of etch-resistant metal.

BRIEF DESCRIPTION OF THE DRAWINGS

The foregoing and other features of the present invention will be more readily apparent from the drawings and the detailed description which follows. Corresponding reference numerals identify corresponding steps, elements and parts throughout the several figures.

DESCRIPTION OF THE PREFERRED EMODIMENTS

Figure 1:
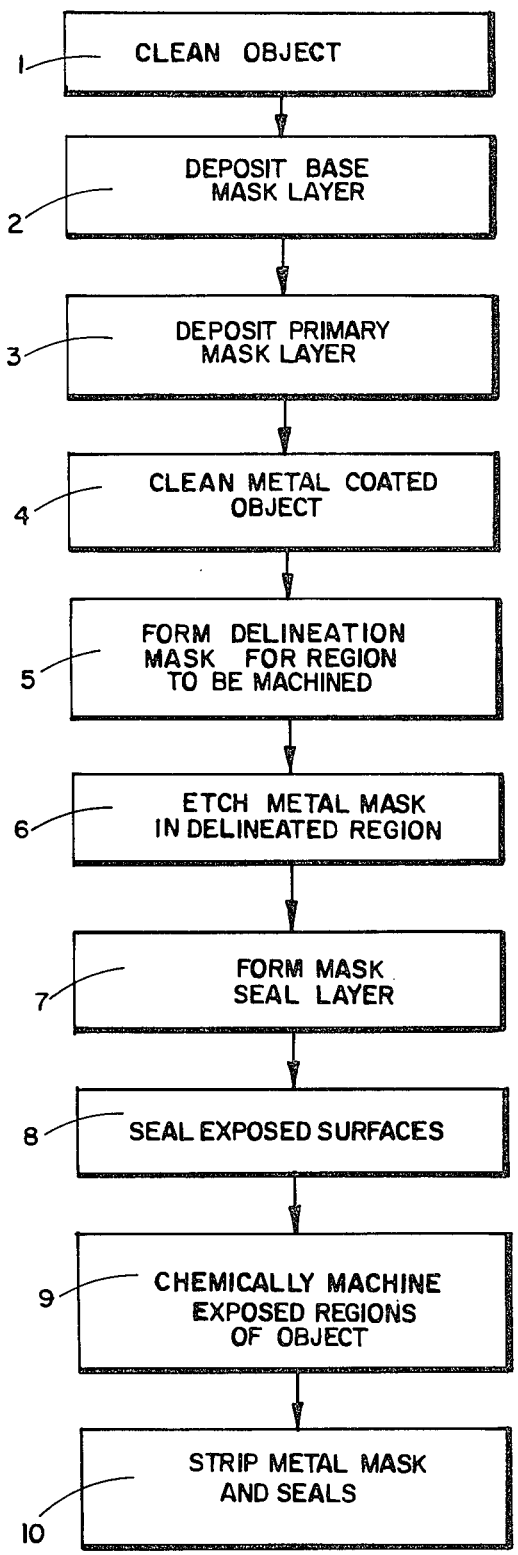
FIG. 1 is a block diagram of the steps of one embodiment of the chemical machining process of the instant invention.

With reference to FIG. 1, there will now be described the method of chemically machining objects of silica or glass according to a preferred embodiment of the present invention. In Step 1, in order to assure a highly adherent bond between the object or part to be machined and material which is to be subsequently deposited directly thereon, the surface of the part is cleaned. Procedures for cleaning silica and glass surfaces are well known in the art. In one preferred procedure, the part is immersed in a bath of chromic-sulfuric acid glass cleaner and then rinsed in deionized water. The part is then baked to dehydrate its surface and to remove therefrom any remaining traces of oil, grease or other organic material which may be present. The baking may be accomplished in an oven for about one-half hour at 600° C or, alternatively, for a few minutes in a vacuum deposition chamber at a temperature which need not exceed 200° C.

In Step 2, a base layer for an etching mask is deposited on the part. The material deposited to form the base mask layer must be highly adherent to silica or glass, adherent to material which is subsequently deposited thereon, at least moderately resistant to acid fluoride etchants, and capable of being deposited without undue difficulty. One of the few materials which satisfies the requirements set forth above is chromium. In this embodiment of the present invention, in Step 2, a relatively thin layer of chromium is deposited on the cleaned surface of the silica or glass part. The deposition is preferably accomplished by the well-known technique of evaporation from a source of the metal heated by a tungsten filament in a vacuum chamber. However, any other of the several well-known techniques for depositing chromium, e.g., sputtering or electron beam evaporation, may be used if desired.

The preferred thickness for the base mask layer of chromium is in the range from about 100 to 300 angstroms. For base mask layer thicknesses less than about 50 angstroms, the adhesion of a primary mask layer, discussed hereinafter in connection with Step 3, to the base mask layer is likely to be seriously impaired.

The surface of the part of silica or glass is frequently highly stressed. This is the case, for example, where the part is cut from a crystal of quartz and its surface is then polished and lapped. Deposits of chromium are also highly stressed and the stresses increase as the thickness of the deposited layer increases. Excessive stresses in the base mask layer will cause the layer to peel from the silica or glass surface. When such peeling occurs, fragments of the silica or glass are frequently cracked from the surface of the part which usually renders the part unusable. To keep the stresses which cause such peeling within acceptable bounds, the base mask layer of chromium deposited should be no thicker than about 1000 angstroms.

In Step 3, a primary layer for an etching mask is next deposited on the base mask layer. The material deposited to form the primary mask layer must be highly resistant to acid fluoride etchants, adherent to the material of the base mask layer, and capable of being deposited without undue difficulty. In the preferred embodiment of this invention, the material for the primary mask layer may be either copper, nickel, cobalt, gold or silver. Each of these metals satisfies the listed requirements and is also capable of being deposited in the same manner as chromium. The latter characteristic is desirable since it permits both the base mask layer and the primary mask layer to be deposited sequentially in the same vacuum chamber without breaking the vacuum. However, if desired, any of the other well-known alternative techniques for depositing any of these metals such as sputtering may be used.

The primary mask layer of copper, nickel, cobalt, gold or silver is deposited to a thickness of at least 1000 angstroms and preferably about 2000 angstroms. Deposits of these metals are not so highly stressed as deposits of chromium and thus thicker layers thereof may be used safely.

The strength of the adhesive bond between the base mask layer and the primary mask layer may be enhanced, for some of the above-mentioned primary mask layer metals, by including some nickel in the chromium of the base mask layer. As much as 50% of the base mask layer may be nickel, mixed or alloyed with the chromium, without causing significant degradation of the adhesion of the base mask layer to the surface of the silica or glass part. The enhancement of the bond between the base mask layer and the primary mask layer, when nickel is included in the former layer, is particularly noticeable when the latter layer is of copper or gold.

Of the several materials listed above as being suitable for the primary mask layer, copper is regarded as the most desirable one to use in this embodiment of the present invention due to its relatively low cost and due also to the relative ease of working with copper by widely known and well established techniques for depositing it, cleaning it, etching it and so forth.

In a modified version of this embodiment of the present invention, Step 3 may be accomplished by depositing a primary mask layer of either palladium or platinum on the base mask layer. These two metals differ from the materials previously mentioned in that palladium and platinum are not readily deposited by evaporation from a source heated by a tungsten filament. Due to the relatively higher vaporization temperatures and pressures of palladium and platinum, these metals are preferable deposited by sputtering although deposition by electron beam vaporization is also suitable. A primary mask layer of either palladium or platinum is both satisfactory adherent to a base mask layer of chromium and resistant to acid fluoride etchants.

While it may not be necessary in every case, once the base mask layer and the primary mask layer are deposited on the part, it is considered good practice to sinter the composite. Where the mask layers have been deposited in a vacuum chamber, the sintering is readily accomplished by keeping the part in the evacuated chamber for an additional hour while maintaining the temperature of the part in the range between 100° C and 300° C. Otherwise, the composite may be sintered in any suitable furnace. Where the primary mask layer is of copper, which oxidizes readily, the furnace should be provided with an inert atmosphere. Sintering improves the adhesion of the base mask layer to the silica or glass surface of the part while promoting diffusion and adhesion at the interface between the base and primary mask layers. For convenience, the optional sintering step is omitted from FIG. 1.

After removal of the part from the vacuum chamber or furnace, the part is cleaned as indicated in Step 4 of FIG. 1. This may be accomplished by swabbing the part with any degreasing solvent which does not attack metals as, for example, methyl ethyl ketone. The part is then rinsed in isopropanol and blown dry with nitrogen.

In Step 5 of FIG. 1, a delineation mask is next formed on the primary mask layer to delineate those regions of the primary and base mask layers which must subsequently be removed in Step 6 to expose those portions of the part which are to be chemically machined. This delineation mask may be formed in one of several possible ways. For relatively small parts and where the regions to be delineated are required to be defined with relatively high precision, photoresist is preferably used. A layer of photoresist, preferably of the type which is applied as a dry film, is laminated to the part, exposed, and then developed in the usual manner to form a photomask on the primary mask layer. Where precise definition of the region to be delineated is of lesser importance, a delineation mask having the required pattern may be formed on the primary mask layer by screen printing techniques. Here, screening inks of resinous materials which are cured by heat or, in some cases, by radiation are used as the maskant. For relatively large parts and relatively large regions to be chemically machined, a delineation mask may be formed by flowing a relatively thick layer of a wax, asphalt, a plastisol or the like onto the surface of the part. After this type of maskant hardens or is cured, the regions requiring delineation may be exposed by cutting into the maskant with a knife or the like and peeling the maskant away in the appropriate places.

Once the delineation mask is formed, the delineated region of first the primary mask layer and then the underlying base mask layer are removed by ethcing as indicated in Step 6 of FIG. 1. Where the primary mask layer is of copper, nickel or cobalt, the delineated portion may be removed using an aqueous etchant of, for example, 42° Baume ferric chloride. Aqua regia may be used to remove palladium and platinum. Silver may be removed using a concentrated ferric nitrate solution. Gold is conveniently removed using potassium trixozide. All of these aqueous etchants will remove the specified metals in a reasonably short time at room temperature, viz, approximately 23° C. Other etchants which may be used to remove the particular metal used for the primary mask layer are well known to those skilled in the art. The particular aqueous etchants listed above are given by way of example.

For forming a precise etching mask, it is desirable that the delineation etching of the primary mask layer be controlled to remove no more of that layer in the lateral direction than is unavoidable. This control involves two considerations. First, the etching of this primary mask layer should be halted by, for example, rinsing off the etchant with water as soon as the base mask layer is exposed. Second, the subsequent etching away of the base mask layer in the delineated region should be accomplished using an etchant which does not attack the metal of the primary mask layer significantly so that undercut thereof is minimized. Two examples of selective etchants which may be used to remove the delineated region of the base mask layer of chromium or nickel-chromium are (1) 45 grams per liter of stannous chloride in concentrated hydrochloric acid preferably warmed to 90° C and (2) 100 grams per liter of ceric sulfate in ten volume percent nitric acid preferably warmed to 30° C.

All of the etching solutions expressly listed above for removing the primary mask layer and then the base mask layer are selective in yet another way. That is, these etchants are compatible for use with the materials suggested above for forming the delineation mask in that the etchants do not react significantly with the delineation maskant materials in the relatively short times required to remove the delineated portions of the primary and base mask layers.

After the base and primary mask layers are formed and then etched away in the delineated region, the delineation mask is removed. The base and primary mask layers formed as set forth above will ordinarily have a certain degree of porosity and also will occasionally have surface defects therein. A low-stress mask seal layer may be formed, as indicated in Step 7, on the primary mask layer to seal any such pores and defects of the etching mask against penetration of acid fluoride etchant therethrough during a subsequent relatively long duration contact with the etchant. Without a suitable seal mask layer, penetration of the etching mask by the etchant is likely to occur resulting in damage to the surface finish of the silica or glass part.

A suitable mask seal layer may be formed of either paraffin or a chlorinated fatty acid wax. The wax, dissolved in a suitable solvent, may be applied to the primary mask layer using a brush. The application of the wax is controlled to keep it at least a small distance away from the edges of delineated regions in the etching mask. The purpose of such control is to preserve dimensional precision of the delineated regions.

Wherever the part has surfaces of silica or glass which are not to be machined but which are left uncovered by the formation of the etching mask as set forth above, these surfaces must also be protected from contact with acid fluoride etchant. To provide this protection, as indicated in Step 8 of FIG. 1, these exposed surfaces are also sealed. A seal for the exposed surfaces may be formed of a thick wax layer using substantially the same procedure as set forth in the discussion of Step 7. In this case, the wax provides adequate protection against etchant for long duration exposure thereto since it is highly adherent to the metal of the etching mask at the edges of the seal surrounding and covering the exposed surfaces.

An alternative procedure for forming the etching mask seal layer in accordance with Step 7 of FIG. 1 is to electroplate one or more layers of metal onto the primary mask layer. This may be preferable to the use of wax for the mask seal layer in cases where highly precise definition of the delineated regions is required to be maintained. In every case where electroplating is used, well known baths for producing low stress electrodeposits are used. Where the primary mask layer is of copper, silver or gold, the preferred electroplating approach is to first electroplate a layer of tin to a thickness of between about 0.1 to 1.0 mils on the primary mask layer and then electroplate a layer of lead having a thickness of between 1 to 2 mils on the tin. These two metals are then fused and flowed using heat to form a low stress seal for pores and surface defects in the primary mask layer. The tin assures that the seal mask layer will be adherent to the primary mask layer while the lead is known to be highly resistant to acid fluoride etchants. Where the primary mask layer is of nickel, cobalt, platinum or palladium, the preferred electroplating approach for good adhesion is to electroplate a layer of either silver or copper to a thickness of at least two mils on the primary mask layer. Electroplating either copper or silver from cyanide electroplating solutions is known to produce low stress deposits.

While the above approaches for electroplating an etching mask seal layer are preferred, all of the other acid fluoride etch resistant metals mentioned above may be electroplated for this purpose. To provide good sealing, all such deposits of these other metals, viz, cobalt, gold, nickel, palladium or platinum, should have a thickness of at least 2 mils. Good adhesion will be assured when the electroplated layer is a low-stress deposit of the same metal as is used in the primary mask layer, viz, cobalt on cobalt, gold on gold, etc.

Once the formation of the etching mask is completed and otherwise exposed surfaces of the part not requiring machining are sealed, the silica or glass in the delineated regions are contacted with etchant in accordance with Step 9 of FIG. 1. Etchants containing a high concentration of hydrofluoric acid in an aqueous medium may be used. Although the reaction may be carried out at room temperature, higher etching rates may be obtained by heating the etchant to a temperature below the softening point of any wax present. The etching solution is preferably agitated either by stirring or spraying to further increase the etch rate. Fluosilisic acid is a reaction product of hydrofluoric acid and silicon dioxide. In some cases, fluosilisic acid is initially added to the etchant to produce a more uniform etch rate. In any case, some fluorsilisic acid will eventually be present once machining of the silica or glass begins. However, fluosilisic acid attacks lead. Therefore, when lead is used in the mask seal layer for the etching mask, the etchant should be inhibited using chromates and phosphoric acid to reduce its attack on the lead.

After etching to the required depth, the part is rinsed to stop the reaction and then, as indicated in Step 10 of FIG. 1, the etching mask is removed.

Figure 2:
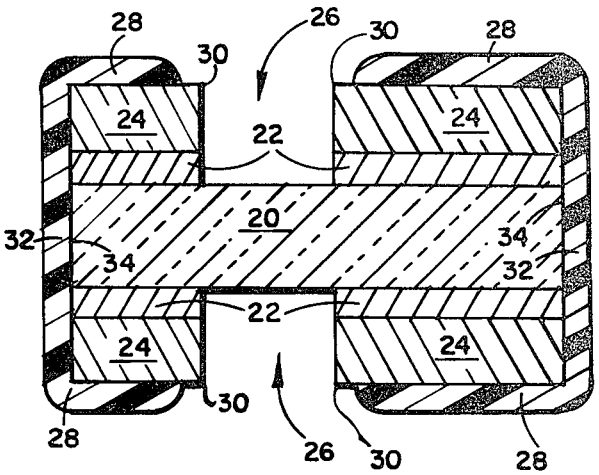
FIG. 2 is a cross-sectional view of an object of silica or glass masked in accordance with the present invention for chemical machining thereof.

Referring now to FIG. 2, there is shown a cross-sectional view of an object provided with a sealed etching mask for chemical machining as set forth above. There is shown a part 20 of glass or of any of the single-crystal, polycrystalline or amorphous forms of silica. An etching mask is shown comprising adherent base mask layers 22 on the top and bottom surfaces of the part 20 and primary mask layers 24 on the base mask layers 22. The base and primary mask layers have been removed in the delineated regions 26. Mask seal layers 28 are provided on the primary mask layers 24. Layer 28 is kept away from the edges 30 of the delineated regions 26 to avoid altering the dimensions thereof. Seals 32 cover what might otherwise be exposed surfaces 34 of part 20. In this embodiment, wax is suggested for both the mask seal layers 28 and the seals 32 and so the wax is shown in FIG. 2 as one continuous film. For convenience in illustrating the concepts herein, FIG. 2 is not drawn to scale.

Figure 3:
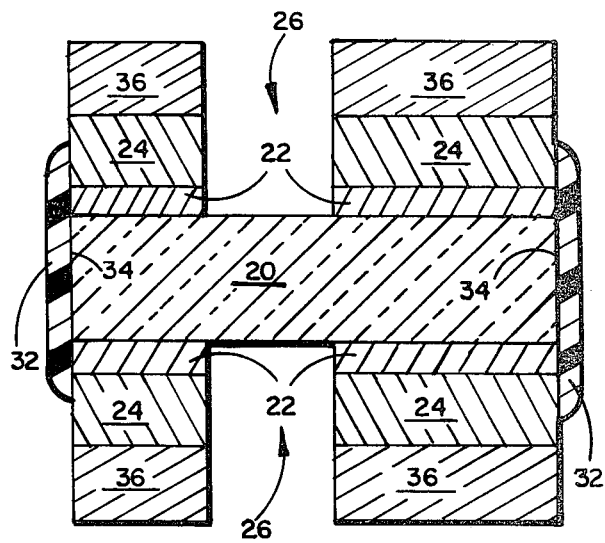
FIG. 3 is a cross-sectional view of an object of silica or glass masked in accordance with the present invention wherein the etching mask has an outer seal layer formed by electroplating.

FIG. 3 is similar to FIG. 2 in that it shows a cross-sectional view of an object provided with a sealed etching mask for chemical machining in accordance with Steps 1–8 of the method of FIG. 1. FIG. 3 differs from FIG. 2 in that mask seal layers 36 of electrodeposited metal replaced the wax mask seal layers 28 of FIG. 2. Wax seals 32 for the exposed surfaces 34 of the part 20 are shown in FIG. 3 as being distinct from the mask seal layers 36. In all other respects, FIGS. 2 and 3 are identical.

Molybdenum and tungsten also have properties making them suitable for use in forming etching masks for chemical machining of silica or glass. Each of these metals is highly adherent to silica or glass surfaces and each is also highly resistant to acid fluoride etchants. In addition, either molybdenum or tungsten may be deposited in relatively thick layers having relatively low stress. The preferred method of depositing either molybdenum or tungsten is by electron beam vapor deposition due to their relatively high vaporization temperatures and pressures. For this reason, the use of molybdenum or tungsten with relatively low melting-point glasses may have to be avoided. Either molybdenum or tungsten may be used to form a base mask layer. Primary mask layers of cobalt, copper, nickel, palladium or platinum will adhere satisfactorily to molybdenum or tungsten base mask layers. Either molybdenum or tungsten may also be used to form a primary mask layer adhering to a base mask layer of molybdenum, tungsten, chromium or nickel-chromium.

In a second embodiment of this invention which, for convenience, has not been expressly illustrated in the figures, Steps 2 and 3 of FIG. 1 are preferably combined into a single step wherein a single layer of either molybdenum or tungsten is deposited to a thickness of no less than 2000 angstroms directly onto the cleaned silica or glass surface of the part to be machined. In effect, the base mask layer and the primary mask layer are combined into a single etching mask layer in this embodiment. The method of this second embodiment is then followed in the same manner as has been set out above for Steps 4–10 of FIG. 1. Where molybdenum is used, the delineated regions of the mask may be etched (as in Step 6 of FIG. 1) using an etchant of equal volumes of nitric acid, sulfuric acid and water warmed to 30° C. Where tungsten is used, the delineated regions of the metal mask may be etched using an etchant of 40 volume percent sulfuric acid, 25 volume percent nitric acid, 5 volume percent hydrofluoric acid and the balance water warmed to 30° C. The preferred mask seal layer for etching masks formed of these metals is of paraffin or chlorinated fatty acid wax as discussed in connection with Step 7 of FIG. 1. Electroplated mask seal layers of cobalt, copper, gold, nickel, palladium, platinum or silver are suitable for use with etching masks of molybdenum or tungsten. since neither molybdenum nor tungsten are readily electroplated, they are not suitable for forming electrodeposited mask seal layers.

Figure 4:
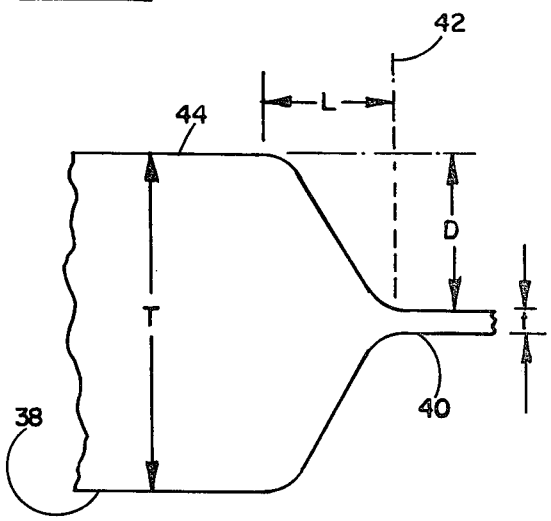
FIG. 4 is a sketch of a portion of a chemically machined article wherein certain dimensions are shown for illustrating results of machining.

FIG. 4 is a sketch of a portion of an article 38 of, for example, single-crystal quartz chemically machined to have a thin flexure region 40. In one application, given here by way of example, the original thickness T of the quartz blank 38 is 30 mils while the finished thickness $t$ of the machined flexure region is 2 mils. Thus, the depth of vertical etch D made on either side of the quartz blank 38 is 14 mils. Lateral undercut is illustrated in FIG. 4 by the lateral distance L from dashed line 42 to the top surface 44 of the quartz blank 38. Dashed line 42 represents the location of an edge of a delineated region formed in an etching mask. Using an etching mask formed in accordance with the present invention to chemically machine the flexure region 40, the average ratio of L to D obtained was about 0.64 to 1. The etching mask used included a base mask layer of nickel-chromium, a primary mask layer of copper and a mask seal layer of wax. The quartz blank 38 was etched for about 2 hours and 35 minutes in 70% by weight hydrofluoric acid. Prior art methods for producing the article 38 represented in FIG. 4 required significantly longer etching times and the resulting undercut ranged from a minimum observed ratio of L to D of 1.0 to ratios well in excess of 4.0 depending on variations in the prior-art method used.

While the invention has been described with reference to certain preferred embodiments thereof, it will be understood by those skilled in the art that various changes in details may be made therein without departing from the spirit and scope of the invention as set forth in the following claims.

What is claimed is:

1. A method of chemically machining relatively deep cuts in an object of a material of a type which is conventionally etchable by acid fluoride etchants, said method comprising:
   forming an etching mask which is both highly adherent to said material and highly resistant to acid fluoride etchants by depositing, in a vacuum chamber, a relatively thin layer of a first metal immediately on a surface of said object wherein said first metal is highly adherent to said material;
   selectively defining a region of said object for chemical machining by removing said etching mask from said surface in said region;
   covering said etching mask with a relatively thick, relatively stress-free layer of sealing material by electrodepositing a layer of a second metal immediately on said etching mask;
   then, after said step of forming said etching mask and said step of covering said etching mask with said layer of sealing material are completed, contacting said object in said region with acid fluoride etchant for a period of time sufficient to machine a cut in said object to a depth of at least about one mil; and
   removing said etching mask and said layer of sealing material.

2. The method recited in claim 1 wherein said forming step comprises the steps of:
   depositing a base mask layer of said first metal highly adherent to said material on said surface of said object; and
   depositing, in a vacuum chamber, a primary mask layer of a relatively thin layer of a third metal highly resistant to acid fluoride etchants immediately on said base mask layer wherein said primary mask layer is deposited to be thicker than said base mask layer.

3. The method recited in claim 2 wherein the combined thickness of said base mask layer and said primary mask layer is no less than about two thousand angstroms.

4. The method recited in claim 2 wherein said first metal is selected from the group consisting of chromium and a mixture of chromium and nickel.

5. The method recited in claim 4 wherein said base mask layer is deposited to have a thickness no greater than about one thousand angstroms.

6. The method recited in claim 2 wherein said primary mask layer is deposited to have a thickness no less than about one thousand angstroms.

7. The method recited in claim 4 wherein said third metal is selected from the group consisting of cobalt, copper, molybdenum, nickel, palladium, platinum, silver and tungsten.

8. The method recited in claim 2 wherein said first metal is selected from the group consisting of molybdenum and tungsten.

9. The method recited in claim 8 wherein said third metal is selected from the group consisting of cobalt, copper, molybdenum, nickel, palladium, platinum and tungsten.

10. The method recited in claim 1 wherein said second metal is selected from the group consisting of cobalt, copper, gold, nickel, palladium, platinum, silver, lead, and tin.

11. The method recited in claim 1 wherein said first metal is selected from the group consisting of molybdenum and tungsten.

12. A method of chemically machining relatively deep cuts in an object of a material of a type which is conventionally etchable by acid fluoride etchants, said method comprising:
    forming an etching mask which is both highly adherent to said material and highly resistant to acid fluoride etchants by depositing, in a vacuum chamber, a relatively thin layer of a first metal immediately on a surface of said object wherein said first metal is highly adherent to said material;
    selectively defining a region of said object for chemical machining by removing said etching mask from said surface in said region;
    covering said etching mask with a relatively thick, relatively stress-free layer of sealing material immediately on said etching mask;
    then, after said step of forming said etching mask and said step of covering said etching mask with said layer of sealing material are completed, contacting said object in said region with acid fluoride etchant for a period of time sufficient to machine a cut in said object to a depth of at least about one mil; and
    removing said etching mask and said layer of sealing material.

13. The method recited in claim 12 wherein said sealing material is selected from the group consisting of paraffin and chlorinated fatty acid waxes.

* * * * *